United States Patent [19]

DeRienzo

[11] 4,282,489

[45] Aug. 4, 1981

[54] METASTABLE DETECTOR

[75] Inventor: William T. DeRienzo, Pompano Beach, Fla.

[73] Assignee: Harris Data Communications Inc., Dallas, Tex.

[21] Appl. No.: 38,425

[22] Filed: May 14, 1979

[51] Int. Cl.³ .................. H03K 5/153; H03K 5/24; H03K 19/003

[52] U.S. Cl. .................. 328/206; 307/354; 307/355; 307/360; 307/291

[58] Field of Search .............. 307/354, 355, 360, 291, 307/238; 328/206; 324/83 D

[56] References Cited

U.S. PATENT DOCUMENTS

| | | | |
|---|---|---|---|
| 3,515,998 | 6/1970 | Adams et al. .................. | 328/206 |
| 3,612,907 | 10/1971 | Braunholtz .................. | 307/291 X |
| 3,764,920 | 10/1973 | Galcik et al. .................. | 307/208 X |
| 3,787,735 | 1/1974 | DeWitte et al. .................. | 307/360 X |
| 3,824,409 | 7/1974 | Patil .................. | 307/241 X |
| 3,971,960 | 7/1976 | Means et al. .................. | 328/206 |
| 4,093,878 | 6/1978 | Paschal et al. .................. | 307/291 |
| 4,149,160 | 4/1979 | Bozarth et al. .................. | 307/360 X |

Primary Examiner—John Zazworsky
Attorney, Agent, or Firm—Craig and Antonelli

[57] ABSTRACT

A metastable arbiter circuit for determining the state of a monitored flip-flop contains an additional flip-flop that is provided on the same semiconductor chip as the operating flip-flop, the metastable condition of which is to be monitored. This additional flip-flop is hardwired in the SET state, so that its high and low outputs can be referenced to indicate when a defined state condition has been achieved in the operating flip-flop. The Q and $\overline{Q}$ outputs of the second flip-flop from which a pair of reference voltages are derived are applied to a pair of comparators, one comparator being used for negative referencing, the other for positive referencing. Through this circuit combination, there is achieved both level detection and hysteresis to produce a high true output when the complementary outputs of the operating flip-flop have reached a defined stable state.

14 Claims, 2 Drawing Figures

METASTABLE DETECTOR

BACKGROUND OF THE INVENTION

1. Field of the Invention

The present invention relates to logical switching circuits and, more particularly, to a scheme for resolving the metastable condition of bistable logic elements operating in response to asynchronously-applied logic signals.

2. Description of the Prior Art

A significant feature of the continuing development and refinement of data processing systems is the increasing speed at which the systems are capable of operating. Synchronous systems, which operate in accordance with a well-defined and predictable timing sequence, are limited in this regard and, accordingly, have given way to systems which operate asynchronously, namely, without regard to the relative timing relationships among the signals that pass through the system. Now, although asynchronous systems offer the advantage of high speed, the arbitrary manner in which signals are generated and processed through the system gives rise to problems of instability and erroneous operation.

As an example, consider the logical operation carried out by a two input AND gate, when the signal levels applied to its respective inputs happen to change logic levels at the same time; namely, their respective rising and falling edges overlap. The output of the AND gate in this case may be a pulse of reduced amplitude (relative to the normal high state-to-low state amplitude), sometimes termed a "runt" pulse. If the output of the AND gate is coupled to an input of a flip-flop, the flip-flop may attempt to respond to the pulse, but because of the distorted characteristics of the pulse created by the asynchronous application of changing logic levels to the preceding AND gate, the flip-flop may go into a state wherein its electronic components, i.e., transistors, are in a region below the saturated condition, causing the flip-flop to oscillate or otherwise behave in a manner other than as intended. Eventually, the flip-flop will become stable after some indeterminate period of time. Unfortunately, during the time that the flip-flop is in this "metastable" condition, variations in the outputs of the flip-flop may propagate through subsequent logic circuitry, causing erroneous system operation.

One way to handle the metastable problem would be to gate the outputs of all flip-flops, using a time out or wait time, sufficiently long to cover the indeterminate "hang-up" period, so that only correct signal conditions would be propagated through subsequent logic circuitry. This approach, however, acts to defeat the advantage that asynchronous system operation was intended to provide, i.e., speed.

Another approach is the incorporation of a decision circuit which monitors the state of the flip-flop and, in response to a switching signal having been applied to the flip-flop, generates an output only after it has detected that the state of the flip-flop has been truly changed to a correct logic level. Namely, the decision circuit observes the disappearance of the metastable state and the reappearance of a stable state before delivering an output to downstream logic circuitry. A prior art configuration for implementing this approach is described in the U.S. patent to Adams et al, U.S. Pat. No. 3,515,998.

In accordance with the technique described in the patent, the operation of a flip-flop that may be subject to an unstable condition is monitored by a pair of threshold circuits connected to the same output of the flip-flop. One of the threshold circuits, termed a high threshold circuit, delivers a true output when the flip-flop output exceeds the upper threshold. The other threshold circuit, termed a lower threshold circuit, delivers a true output when the flip-flop output exceeds the lower threshold. Otherwise, the outputs of each threshold circuit are false. The output of the high threshold circuit is inverted and logically "AND"ed with the output of the low threshold circuit, to provide an indication of whether the flip-flop is an unstable or stable condition. This indication can, accordingly, be used to permit or inhibit the propagation of the flip-flop output to downstream logic circuitry.

Now, although the technique described in the Adams et al patent seeks to improve upon the timeout approach discussed previously, it fails somewhat in this respect because it references the threshold decision process for all flip-flops at the same set of comparison levels, so that there is built into the system an inherent delay time directly attributable to a broad-based comparison scheme.

Other proposals to treat the metastable problem are described in the U.S. patents to Means et al, U.S. Pat. No. 3,971,960, Paschal et al, U.S. Pat. No. 4,093,878, Bedford et al, U.S. Pat. No. 3,983,496, Braunholtz, U.S. Pat. No. 3,612,907, Patil, U.S. Pat. No. 3,824,409, and Galcik et al, U.S. Pat. No. 3,764,920. Still, like the patent to Adams et al, each of these proposed schemes offers a solution that is not entirely satisfactory either because of its implementation or from a signal processing standpoint.

SUMMARY OF THE INVENTION

In accordance with the present invention there is provided a new and improved arbiter circuit for detecting the existence of and termination of the metastable condition in a bistable logic circuit element, i.e., a flip-flop, that obviates shortcomings associated with prior art solutions to the problem, referred to above, while providing a more accurate and rapidly responding device, thereby more closely serving the needs of asynchronous data processing systems than heretofore attained.

To this end, the metastable arbiter circuit of the present invention is configured of an additional flip-flop that is provided on the same semiconductor chip as the operating flip-flop, the metastable condition of which is to be monitored. This additional flip-flop is hardwired in the SET state, so that its high and low outputs can be referenced to indicate when a defined state condition has been achieved in the operating flip-flop. The Q and $\overline{Q}$ outputs of the second flip-flop from which a pair of reference voltages are derived are applied to a pair of comparators, one comparator being used for positive referencing and the other comparator being used for negative referencing. Through this circuit combination there is achieved both level detection and hysteresis to produce a high true output when the complementary outputs of the operating flip-flop have reached a defined stable state.

DETAILED DESCRIPTION OF THE INVENTION

Figure 1:
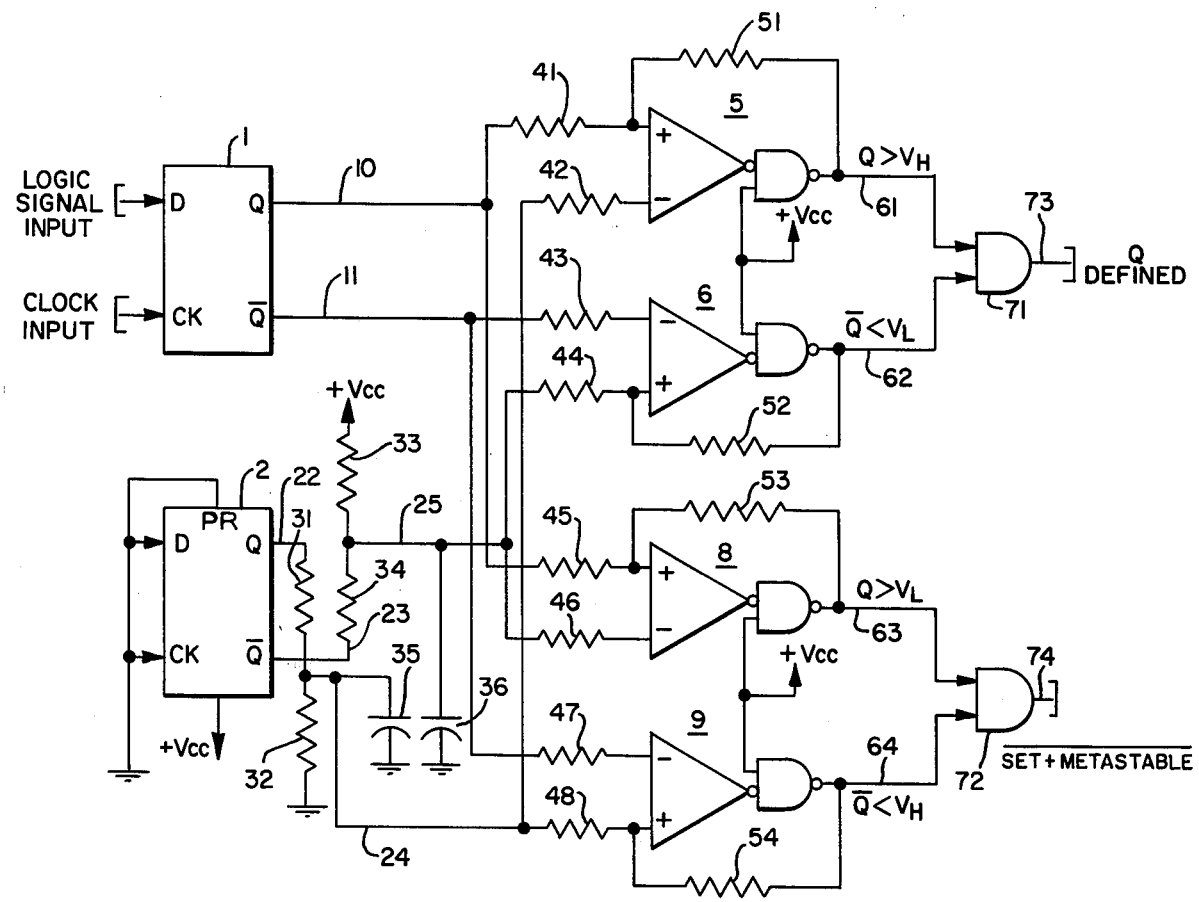
FIG. 1 is a schematic illustration of a preferred embodiment of the present invention.

Referring now to FIG. 1, there is shown a metastable arbiter circuit configuration in accordance with the present invention designed to monitor the condition (metastable, transient, or stable) of flip-flop 1, the clock and set inputs of which are coupled to receive respective asynchronously-applied input signals. As was explained previously, even in an asynchronous signaling environment, state defining inputs to flip-flop 1 will normally arrive sufficiently separated in time to permit the flip-flop to be switched immediately into one of its bistable states. However, should the input signal characteristics be such as to create a metastable condition, further signal propagation downstream of flip-flop 1 is inhibited until the metastable condition disappears.

Monitoring of the condition of flip-flop 1 is achieved by the incorporation of a set of four hysteresis comparators 5, 6, 8, and 9 and a reference voltage flip-flop 2, the set and clock inputs of which are strapped low, as shown, to force flip-flop 2 into a permanent SET condition, so that its Q output is always true (high voltage level) and its $\overline{Q}$ output is always false (low voltage level). It should be noted that each of the components of FIG. 1 is preferably configured as part of the same LSI wafer, as may be commonly employed in present-day digital data processing systems, so that the physical/electronic properties of the various circuit elements, particularly those of flip-flops 1 and 2, are matched.

To establish the necessary comparison conditions for determining at all times, using a dynamic reference, the state of flip-flop 1, its Q output is coupled over line 10 through resistors 41 and 45, respectively, to the positive inputs of hysteresis comparators 5 and 8. The $\overline{Q}$ output of flip-flop 1 is coupled over line 11, through respective resistors 43 and 47, to the negative inputs of hysteresis comparators 6 and 9. Each hysteresis comparator includes a differential amplifier connected in series with one input of a NAND gate, the other input of which is hardwired high, and a suitable feedback resistor, e.g., resistors 51, 52, 53, and 54 for comparators 5, 6, 8, and 9, respectively, to the positive input of the respective differential amplifiers.

Establishing the dynamic voltage reference is achieved by coupling the Q and $\overline{Q}$ outputs of flip-flop 2 to the other inputs of the comparators. The Q output of flip-flop 2 is coupled over line 22 to a first voltage divider consisting of resistors 31 and 32, connected in series to a low voltage level (ground), with the common connection of resistors 31 and 32 being connected over line 24, through resistors 42 and 48, to the negative and positive inputs of comparators 5 and 9, respectively. The $\overline{Q}$ output of flip-flop 2 is connected over line 23 to a second voltage divider consisting of resistors 33 and 34 connected in series to a high voltage level (+Vcc). The common connection of resistors 33 and 34 is connected over line 25 to the positive input of comparator 6 and to the negative input of comparator 8, through resistors 44 and 46, respectively. Capacitors 35 and 36 are connected between lines 24 and 25 and ground, so as to filter out noise.

The output of comparators 5 and 6 are connected over lines 61 and 62 to the inputs of AND gate 71, while the outputs of comparators 8 and 9 are connected over lines 63 and 64 to the inputs of NOR gate 72. The output 73 of AND gate 71 is true as long as flip-flop 1 is stable, but is low otherwise. The output 74 of NOR gate 72 is used to indicate that the state of flip-flop 1 is changing and will be at a low voltage level when flip-flop 1 is either SET or metastable.

Figure 2:
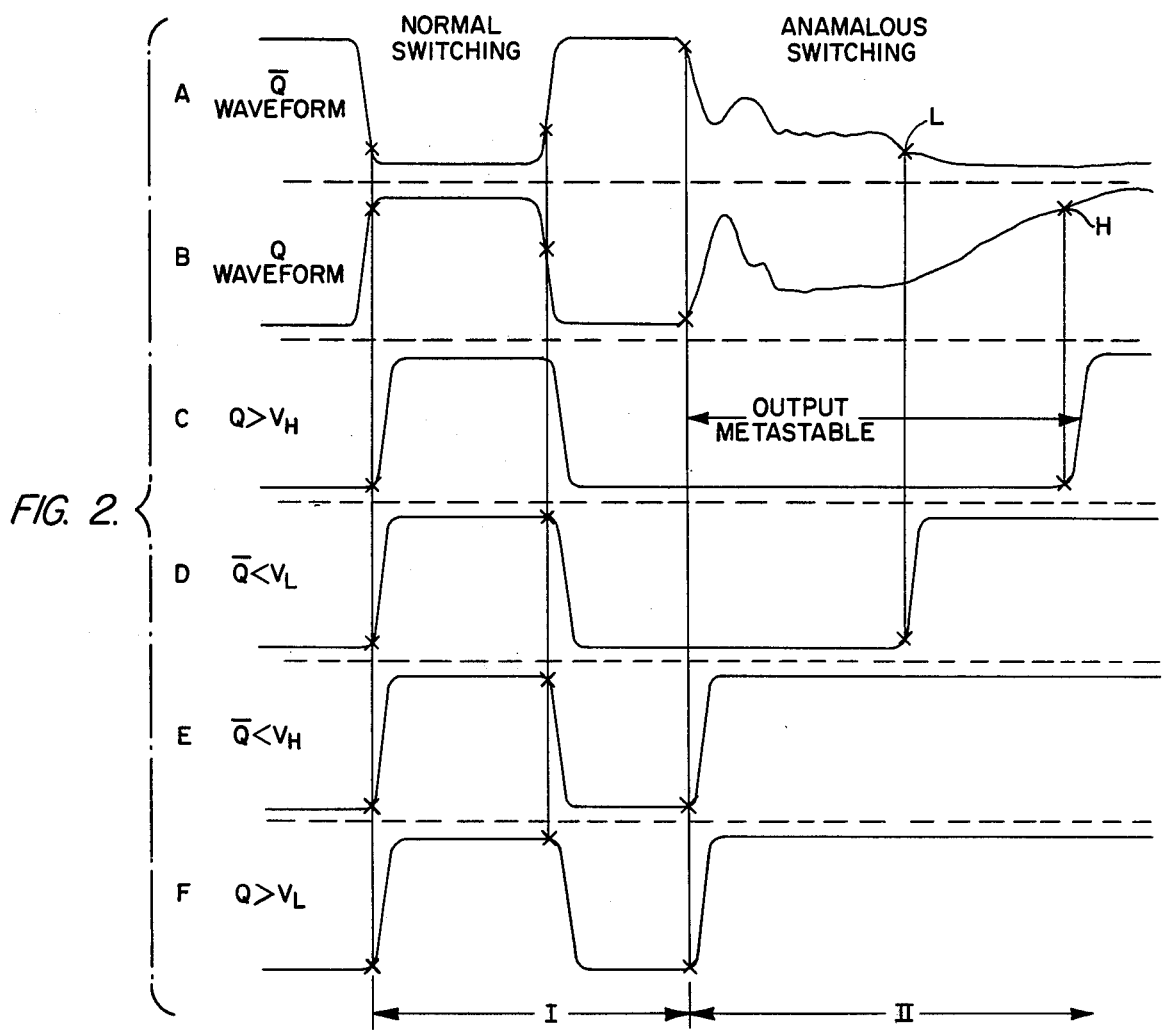
FIG. 2 is an illustration of a set of timing diagrams useful for explaining the operation of the circuit shown in FIG. 1.

The operation of the above-described configuration may be readily understood by reference to the timing diagrams A-F of FIG. 2. Comparator 5 determines when the Q output of flip-flop 1 has passed through a threshold, defined by the first voltage divider, near the $V_{OH}$ level, of flip-flop 2. Similarly, comparator 8 compares the Q output of flip-flop 1 with the lower voltage threshold $V_L$ established by the $\overline{Q}$ output of flip-flop 2. When the Q output of flip-flop 1 exceeds the upper voltage threshold $V_H$, it also exceeds the lower voltage threshold $V_L$, so that the output on line 63 is true (at the high voltage level). Output 61 of comparator 5 will be at a high (true) level when the Q output of operating flip-flop 1 is at a logic high level and is stable; namely, when the Q output of flip-flop 1 is greater than the upper reference voltage level $V_H$ established by the first voltage divider consisting of resistors 31 and 32 connected to the Q output of reference flip-flop 2.

Comparator 6, connected as an inverting differential comparator, determines that the $\overline{Q}$ output of flip-flop 1 has fallen below a threshold established by the second voltage divider near the $V_{OL}$ level of flip-flop 2. Similarly, comparator 9 compares the $\overline{Q}$ output of flip-flop 1 with the upper voltage threshold $V_H$ established by the Q output of flip-flop 2. When the $\overline{Q}$ output of flip-flop 1 is less than the lower voltage threshold $V_L$, it must also be less than the upper voltage threshold $V_H$, so that the output on line 64 is true.

Output 62 of the comparator 6 will be true when the $\overline{Q}$ output of operating flip-flop 1 is at a stable logic low condition; namely, when the $\overline{Q}$ output of the flip-flop 1 is less than the lower reference voltage level $V_L$ established by the second voltage divider consisting of resistors 33 and 34 connected to the $\overline{Q}$ output of reference flip-flop 2.

Thus, during the first portion of time interval I, shown in FIG. 2, flip-flop 1 is stable and SET, so that both inputs to AND gate 71 are high and the output 73 of AND gate 71 is high indicating that flip-flop 1 is in the SET, stable condition. Both inputs to NOR gate 72 are also high at this time so that its output 74 is low. During the latter portion of time interval I, flip-flop 1 is switched to the opposite stable state, or is reset, so that both inputs to AND gate 71 go low and the output 73 of AND gate is low. Input 63 of NOR gate 72 is low so that output 74 of NOR gate 72 goes high. These two logic levels (0 and 1) at the outputs of gates 71 and 72 indicate that flip-flop 1 is stable and reset. It can be seen from time interval I of FIG. 2 that each of the waveforms A-F are effectively synchronized with one another during the stable operation of flip-flop 1.

During anomalous switching of flip-flop 1, as in response to a "runt" pulse created by prescribed asynchronous signaling conditions discussed previously, the state of flip-flop 1 is undefined for a period of time II, as shown in FIG. 2, during which its output is metastable. For this condition, the output of AND gate 71 is false, while the output of NOR gate 72 is false. Since the output of NOR gate 72 is true only during the time that flip-flop 1 is stable in the reset state, an indication of the state of flip-flop 2 can be obtained by observing the logical outputs of both gates 71 and 72.

At the initial portion of the metastable period II both the Q and $\overline{Q}$ outputs of flip-flop 1 are undefined so that both inputs 61 and 62 to AND gate 71 are low and its output 73 is also low. On the other hand, each of inputs 63 and 64 to NOR gate 72 is high, so that its output is low. Eventually, during the metastable period II, the Q and $\overline{Q}$ outputs will cross opposite thresholds ($V_H$ and $V_L$ or $V_L$ and $V_H$) as flip-flop 1 returns to a stable state. In the example illustrated in FIG. 2, the $\overline{Q}$ output of flip-flop 1 drops below lower threshold $V_L$ at point L, followed by the Q output of flip-flop 1 exceeding upper threshold $V_H$ at point H. At this time both inputs of AND gate are enabling, so that its output 73 goes high indicating that flip-flop 1 is stable and SET.

Thus, for the conditions 1=true, 0=false, the following table can be defined.

TABLE

| AND GATE 71 | NOR GATE 72 | FLIP-FLOP 1 CONDITION |
| --- | --- | --- |
| 1 | 0 | STABLE AND SET |
| 0 | 1 | STABLE AND RESET |
| 0 | 0 | METASTABLE |

Laboratory investigations have demonstrated that the concurrent occurrence of the Q and $\overline{Q}$ outputs of flip-flop 1 at defined output levels does not occur without the output of flip-flop 1 being stable. Therefore, the high logic level output 73 of AND gate 71 is an accurate indication of the stable set state of flip-flop 1.

The outputs of comparators 8 and 9 also provide an indication of the beginning of a transition for flip-flop 1, and, as shown during time interval II of FIG. 2, outputs 63 and 64 go high prior to the conditions of flip-flop 1 that $Q > V_H$ and $\overline{Q} < V_L$.

While I have shown and described an embodiment in accordance with the present invention, it is to be understood that the same is not limited thereto but is susceptible of numerous changes and modifications as known to one skilled in the art, and I, therefore, do not wish to be limited to the details shown and described herein but intend to cover all such changes and modifications as are obvious to one of ordinary skill in the art.

What is claimed is:

1. A circuit arrangement for detecting the metastable condition of a flip-flop comprising:
    first means for supplying a set of reference voltages respectively related to prescribed state conditions of said flip-flop; and
    second means, coupled to said first means and to said flip-flop, for comparing the respective Q and $\overline{Q}$ outputs of said flip-flop with said set of reference voltages and generating a first prescribed logical output during the period of time that said flip-flop is in a metastable condition and thereafter generating a second prescribed logical output upon the termination of said metastable condition and the return of said flip-flop to one of its bistable conditions.

2. A circuit arrangement according to claim 1, wherein said first means comprises a further flip-flop having a prescribed stable state, from the Q and $\overline{Q}$ outputs of which said set of reference voltages is derived.

3. A circuit arrangement according to claim 1, wherein said second means comprises a plurality of comparators coupled to compare individual respective ones of said reference voltages with the Q and $\overline{Q}$ outputs of said flip-flop and to thereby produce outputs from which said first and second prescribed logical outputs are derived.

4. A circuit arrangement according to claim 3, wherein each of said comparators is a hysteresis comparator.

5. A circuit arrangement according to claim 3, wherein said second means comprises a first comparator for comparing the Q output of said flip-flop with one of said reference voltages and generating a preselected logic output upon said Q output exceeding said one reference voltage, and a second comparator for comparing the $\overline{Q}$ output of said flip-flop with the other of said reference voltages and generating said preselected logic output upon said other reference voltage exceeding said $\overline{Q}$ output.

6. A circuit arrangement according to claim 3, wherein said second means comprises a first comparator for comparing the $\overline{Q}$ output of said flip-flop with one of said reference voltages and generating a preselected logic output upon said one reference voltage exceeding said $\overline{Q}$ output, and a second comparator for comparing the Q output of said flip-flop with the other of said reference voltages and generating said preselected logic output upon said Q output exceeding said other reference voltage.

7. A circuit arrangement according to claim 5, wherein said second means further comprises a third comparator for comparing the Q output of said flip-flop with the other of said references voltages and generating said preselected logic output upon said Q output exceeding said other of said reference voltages, and a fourth comparator for comparing the $\overline{Q}$ output of said flip-flop with said one of said reference voltages and generating said preselected logic output upon said one reference voltage exceeding said $\overline{Q}$ output.

8. A circuit arrangement according to claim 5, wherein said first means comprises a further flip-flop having a prescribed stable state, from the Q and $\overline{Q}$ outputs of which said set of reference voltages is derived.

9. A circuit arrangement according to claim 6, wherein said first means comprises a further flip-flop having a prescribed stable state, from the Q and $\overline{Q}$ outputs of which said set of reference voltages is derived.

10. A circuit arrangement according to claim 7, wherein said first means comprises a further flip-flop having a pescribed stable state, from the Q and $\overline{Q}$ outputs of which said set of reference voltages is derived.

11. A circuit arrangement according to claim 2, wherein each of said flip-flops is formed in the same semiconductor chip.

12. A circuit arrangement according to claim 2, wherein said first means further comprises a pair of voltage dividers coupled to the Q and $\overline{Q}$ outputs of said further flip-flop, said set of reference voltages being supplied by way of said voltage dividers.

13. A circuit arrangement according to claim 8, wherein said first means further comprises a pair of voltage dividers coupled to the Q and $\overline{Q}$ outputs of said further flip-flop, said set of reference voltages being supplied by way of said voltage dividers.

14. A circuit arrangement according to claim 9, wherein said first means further comprises a pair of voltage dividers coupled to the Q and $\overline{Q}$ outputs of said further flip-flop, said set of reference voltages being supplied by way of said voltage dividers.

* * * * *